US005617534A

United States Patent [19]

Balmer et al.

[11] Patent Number: 5,617,534
[45] Date of Patent: Apr. 1, 1997

[54] INTERFACE PROTOCOL FOR TESTING OF A CACHE MEMORY

[75] Inventors: Mark J. Balmer, Tigard; Mark R. Waggoner, Hillsboro, both of Oreg.

[73] Assignee: Intel Corporation, Santa Clara, Calif.

[21] Appl. No.: 582,380

[22] Filed: Jan. 11, 1996

Related U.S. Application Data

[63] Continuation of Ser. No. 198,132, Feb. 16, 1994, abandoned.
[51] Int. Cl.[6] .................................................. G06F 11/00
[52] U.S. Cl. ............................ 395/183.18; 395/185.01; 395/183.12
[58] Field of Search ..................... 395/183.18, 183.08, 395/184.01, 183.21, 185.01, 185.1, 183.01, 183.12, 183.06, 183.07; 371/21.1, 21.2, 21.3, 21.4, 21.5, 21.6

[56] References Cited

U.S. PATENT DOCUMENTS

| Re. 34,445 | 11/1993 | Hayes et al. | 371/21.1 |
|---|---|---|---|
| 4,575,792 | 3/1986 | Keeley | 371/21 |
| 4,686,621 | 8/1987 | Keeley et al. | 371/21 |
| 4,724,531 | 2/1988 | Angleton et al. | 365/189 |
| 4,933,941 | 6/1990 | Eckard et al. | 371/18 |
| 5,043,874 | 8/1991 | Gagliardo et al. | 364/200 |
| 5,202,923 | 4/1993 | Kuriyama | 371/21.1 |
| 5,210,860 | 5/1993 | Pfeffer et al. | 395/575 |
| 5,287,481 | 2/1994 | Lin | 395/425 |
| 5,295,258 | 3/1994 | Jewett et al. | 395/575 |
| 5,311,520 | 5/1994 | Raghavachari | 371/21.6 |
| 5,371,883 | 12/1994 | Gross et al. | 371/19 |

OTHER PUBLICATIONS

"The Metaflow Architecture", pp. 10–13 and 63–73, by Val Popescu, Merle Schultz, John Spracklen, Gary Gibson, Bruce Lightner, and David Isaman, IEEE Micro, 1991.

Primary Examiner—Robert W. Beausoliel, Jr.
Assistant Examiner—Joseph E. Palys
Attorney, Agent, or Firm—Blakely, Sokoloff, Taylor & Zafman

[57] ABSTRACT

A computer system includes a microprocessor and an external cache memory coupled to the microprocessor. The cache memory includes a memory array and an apparatus for initiating a routine to test the integrity of the memory array in response to a signal asserted by the microprocessor. The apparatus generates a two-bit status signal coupled to the microprocessor for communicating IDLE, ACTIVE, PASS and FAIL states of the test routine. The apparatus initiates the test routine a predetermined of number clock cycles after the assertion of the signal provided by the microprocessor.

32 Claims, 3 Drawing Sheets

FIG_1

FIG_3

FIG_4

FIG_2

FIG_5

FIG_6

| BIT 0 | BIT 1 | STATE |
|---|---|---|
| 0 | 0 | FAIL |
| 0 | 1 | IDLE |
| 1 | 0 | ACTIVE |
| 1 | 1 | PASS |

FIG_7

5,617,534

INTERFACE PROTOCOL FOR TESTING OF A CACHE MEMORY

This is a continuation of application Ser. No. 08/198,132, filed Feb. 16, 1994, now abandoned.

FIELD OF THE INVENTION

The present invention relates generally to the field of computer systems which employ a memory hierarchy. More specifically, the invention relates to signaling protocol and apparatus and methods involved in the testing of a cache memory.

BACKGROUND OF THE INVENTION

In the field of computer architecture, the concept of a memory hierarchy organized into several levels, based on different speeds and sizes, has grown in popularity. In most cases, each level of a memory hierarchy consists of a smaller, faster (per byte) memory than the level above.

For example, cache memories have proven to be a valuable aid to a computer architecture since the principal of locality holds that programs which reference an item, also tend to reference that same item shortly thereafter. This means that programs tend to favor a portion of their address space. Therefore computer performance can be maximized by tailoring the memory hierarchy in relation to locality and technology.

Recently, random-access memories (RAMs) have been utilized in the memory hierarchy of computer systems as secondary level cache memories. The primary or local cache memory is often integrated onto the same silicon substrate as the microprocessor or the central processing unit of the computer. In these systems, the microprocessor accesses the secondary cache whenever data needed by the program is not found in the local cache memory. Often times, computer systems that employ a secondary cache memory also employ a third level cache memory and/or a main memory such as a hard disk drive data storage unit.

Because the secondary level cache memory frequently resides on a integrated circuit (IC) that is separate from the IC that includes the computer system's microprocessor, there is requirement for separately testing the integrity of the secondary cache memory in various operating modes and test environments. By way of example, the secondary cache memory should first be tested at the die level to ensure proper functionality. This type of testing typically involves running dynamic test patterns at or above the full rated speed of the device. In addition, memory devices must also be tested for functionality as part of normal burn-in reliability verification. In burn-in testing, the device is placed in a high temperature environment for an extended time. During this time the memory array (and much of the associated logic) is toggled to detect defects in the device.

Lastly, power-on self-testing (POST) is utilized to verify to the customer that the cache memory is operational. This test involves a high degree of logic and RAM functionality at close to the full operational speed of the device.

As will be seen the present invention comprises an interface protocol for testing of a cache memory in a computer system. One of the important advantages of the present invention is that it permits a microprocessor to initiate a built-in self-test routine for checking the integrity of the cache memory. The protocol provides status information of the testing procedure back to the microprocessor.

SUMMARY OF THE INVENTION

A computer system is disclosed which includes a microprocessor and an external cache memory coupled to the microprocessor. The cache memory includes a memory array and an apparatus for initiating a routine to test the integrity of the memory array in response to a signal asserted by the microprocessor. The apparatus generates a multi-bit status signal coupled to the microprocessor for communicating the current status of the test routine.

In one particular embodiment of the present invention, the microprocessor includes a local cache memory and the external cache memory comprises a secondary cache memory of the microprocessor. The status signal comprises a 2-bit signal which communicates IDLE, ACTIVE, PASS and FAIL states of the test routine. In addition, the apparatus initiates the test routine a predetermined of number clock cycles after the assertion of the signal provided by the microprocessor.

BRIEF DESCRIPTION OF THE DRAWINGS

The present invention will be understood more fully from the detailed description which follows and from the accompanying drawings, which, however, should not be taken to limit the invention to the specific embodiments shown, but rather are provided for explanation and understanding only. Note that in FIGS. 3–5 waveforms A,B and C denote the CLOCK, DO_POST, and POST_STATUS signals, respectively.

DETAILED DESCRIPTION

The present invention covers a computer system and cache memory interface protocol that initiates and communicates the status of various testing routines. In the following description, numerous specific details are set forth, such as particular circuits, state diagrams, timing diagrams, etc., in order to provide thorough understanding of the present invention. It should be understood, however, that these specific details need not be used to practice the present invention. In other instances, well known structures, circuit blocks, and architectural functions have not been described in detail in order to avoid unnecessarily obscuring the present invention.

Figure 1:
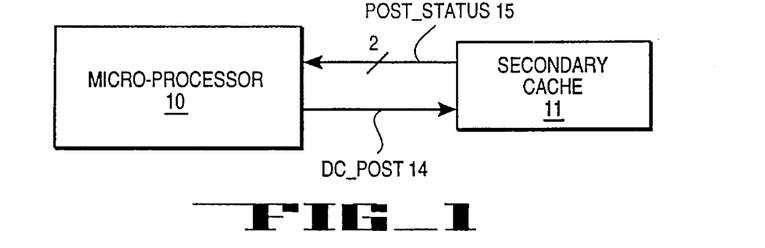
FIG. 1 is a high-level block diagram of the computer system of the present invention.

FIG. 1 is a high level block diagram of the computer system of the present invention including a microprocessor 10 coupled to a secondary cache memory 11. In one embodiment of the present invention, processor 10 and cache memory 11 each comprise separate integrated circuits, i.e., fabricated on separate silicon chips.

Microprocessor 10 preferably comprises any one of a number of microprocessors compatible with the x86 family of microprocessors manufactured by Intel Corporation. In accordance with the present invention, a power-on self-test (POST) routine is initiated upon reset of microprocessor 10, for example, upon turning the power on to the computer system. The POST operation is initiated by the assertion of a DO_POST signal generated by microprocessor 10 along line 14 coupled to secondary cache memory 11.

After the DO_POST signal has been asserted for a predetermined number of clock periods, circuitry incorporated within secondary cache 11 responds to the microprocessor by providing a two-bit encoded POST_STATUS signal along lines 15. The encoding for the POST status in one embodiment of the present invention is as follows: 01=IDLE, 10=ACTIVE, 11=PASS, 00=FAIL.

In accordance with the signaling protocol of the present invention, once DO_POST has been asserted for a predetermined number of consecutive clock cycles, the POST_STATUS bits transition from IDLE to ACTIVE status. This signifies the beginning of the built-in self-test of the secondary cache memory 11. Upon the completion of self-testing (which optionally may be timed to aid in verifying that the self-test does not terminate prematurely) the POST_STATUS bits transition from ACTIVE to PASS/FAIL status. Microprocessor 10 responds to this state transition by deasserting DO_POST, after which time the POST_STATUS signal bits transition back to an IDLE state.

Figure 7:
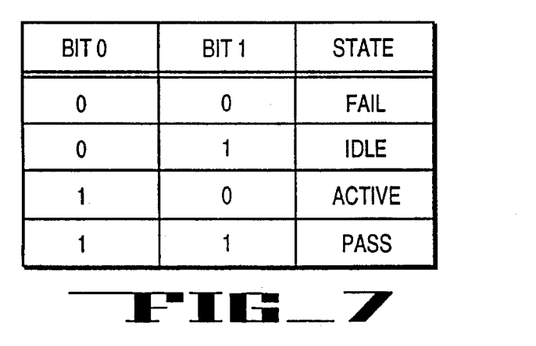
FIG. 7 is a state table for one embodiment of the interface protocol of the present invention.

FIG. 7 is a table illustrating each of the four states (i.e., FAIL, IDLE, ACTIVE, and PASS) designated by the two-bit POST_STATUS signal provided on lines 15 in FIG. 1.

As explained earlier, one of the purposes of the present invention is to provide a check of the integrity of the cache memory and as much of the associated logic that can be captured. The cache memory checking procedure is designed to catch certain types of faults, such as Stuck-At -One or Stuck-At -Zero fault conditions. In addition, the present invention achieves the goal of providing some toggle coverage for burn-in reliability testing.

One of the problems of prior art designs is that when a reset occurs in a computer system or microprocessor, and a power-on self-test is initiated for the cache memories, any error which might occur during the testing procedure could potentially stall the entire system. One of the advantages of the present invention is that it provides on-going status information (i.e., IDLE, PASS/FAIL, ACTIVE) to continually monitor the testing processing. This ensures the data integrity of the transmissions between the processor and the cache memory.

Because memory self-testing often consumes large amounts of time, it is desirable that the processor not wait for the entire testing process to finish. In accordance with the present invention, once microprocessor 10 provides a DO_POST signal to initiate self-testing of secondary cache 11, processor 10 need only monitor the bits on POST_STATUS lines 15 to sense that cache 11 is actively performing its self-test routine. Once microprocessor 10 detects an ACTIVE state on line 15, it is free to continue other processing activities. This provides an advantage in that there is independent control over a reset condition within a computer system of the present invention. Secondary cache 11 provides current data integrity information via status lines 15, as opposed to simply providing a pass/fail indication upon the completion of the self-test routine.

An additional feature of the present invention is that it is capable of accommodating data retention testing in a burn-in environment. Normally, such testing routines cannot be incorporated into a power-on-self-test routine because the period that is required for data retention is somewhat uncertain. As will be described in more detail shortly, the signaling and interface protocol of the present invention allows for a test pattern to be applied in numerous phases; in each phase all of the addresses of cache memory 11 are tested in accordance with specified operations. For burn-in reliability testing, there is also a delay or pause which occurs between each testing phase. This pause, for example, allows errors resulting from charge leakage to be detected.

Practitioners skilled in the art of computer systems will appreciate that the interface protocol of the present invention may be initiated either by a microprocessor coupled to the cache memory in a computer system (as shown in FIG. 1) or, alternatively, utilizing dedicated test circuitry. In the latter case, for example, the DO_POST signal provided to secondary cache 11 might be generated by a tester as part of a functionality or reliability test routine.

Figure 2:
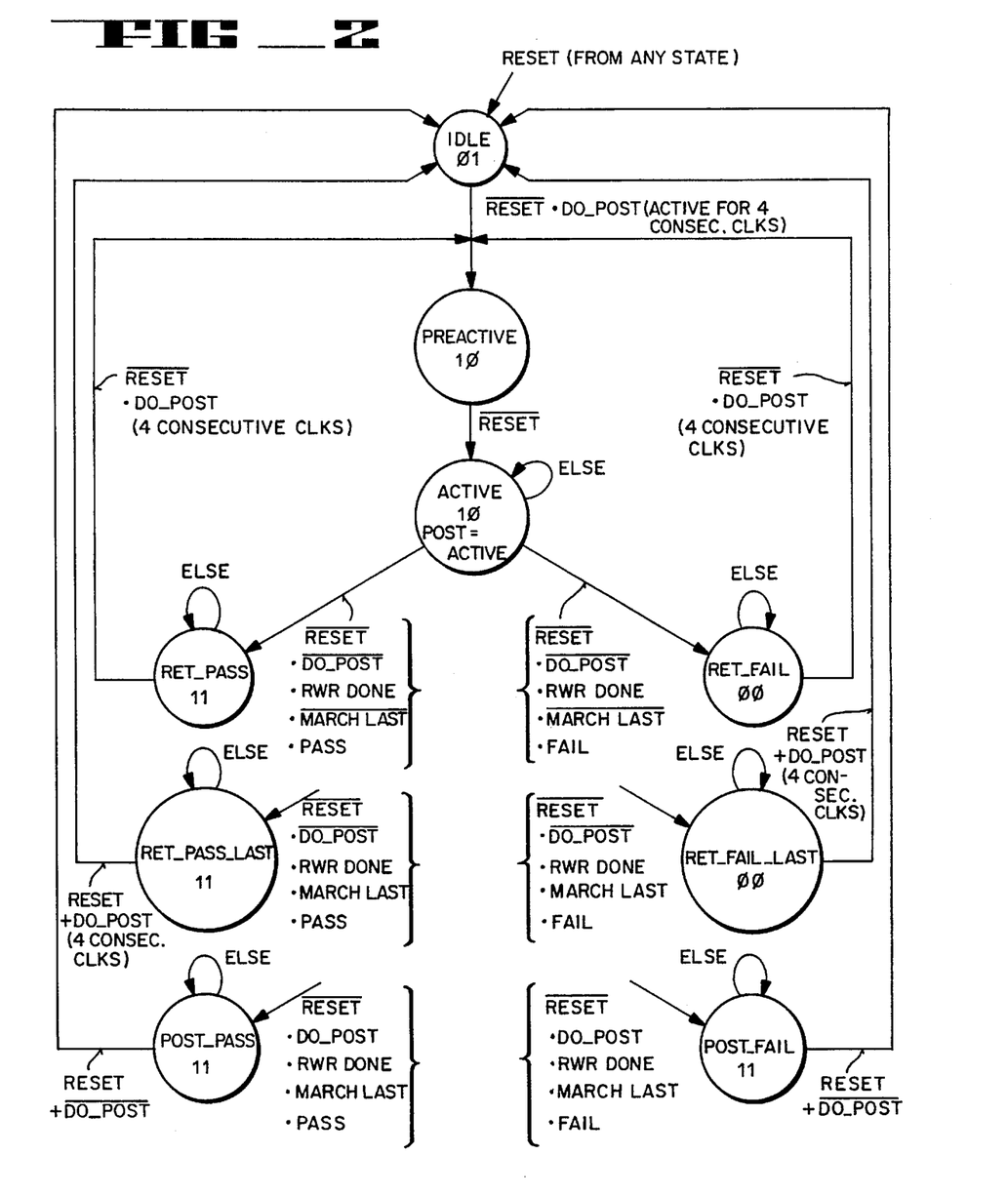
FIG. 2 is a state diagram illustrating the protocol of the present invention.
Figure 3:
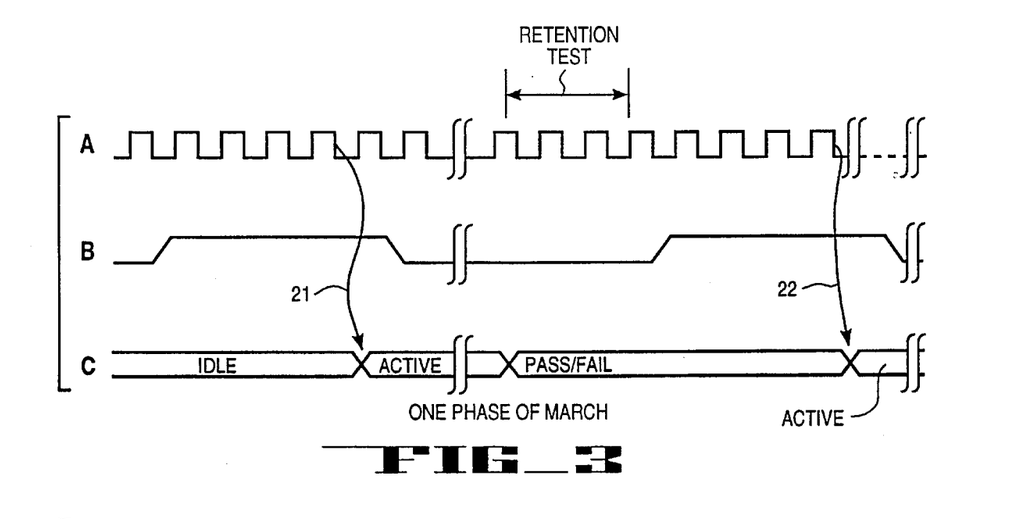
FIG. 3 is a timing diagram showing the relationship between various signals for one mode of operation of the present invention.

With reference now to FIG. 2, there is shown a state diagram for one implementation of the interface protocol of the present invention. In one embodiment, this state diagram defines a state machine that is incorporated into the secondary cache memory 11. The state machine, for example, responds to the DO_POST signal provided by microprocessor 10. To better understand the operation of the present invention, consider the state diagram of FIG. 2 in conjunction with the timing diagrams of FIGS. 3, 4 and 5.

The starting point for the state diagram of FIG. 2 is the IDLE condition (state=01), as shown at the top of the diagram. The IDLE state is entered into following a RESET from any other state, such as when the computer system is initially powered-on, or the microprocessor is reset. Note that the secondary cache does not automatically start power-on self-testing following power-up or a RESET signal. Rather, the state machine within cache memory 11 remains in the IDLE state until DO_POST has been asserted for a predetermined number of clock cycles (e.g., 4 clocks).

As explained above, microprocessor 10 (or a tester) is responsible for initiating the POST by providing the DO_POST signal to secondary cache memory 11. Note that the DO_POST signal must remain active for four consecutive clocks in one embodiment in order to initiate the POST. The requirement for four consecutive clock cycles eliminates spurious or glitching signals from starting POST testing. In other words, the four consecutive clock requirement debounces the DO_POST signal to avoid spurious signals that may be caused by things such as glitches, noise, etc.

Following the fourth consecutive clock cycle after DO_POST has been asserted, the POST_STATUS bits transition to indicate an ACTIVE state (state=10). This is shown occurring in FIG. 4 by arrow 23. Once the cache memory is in the ACTIVE state, it performs its power-on self-test routine. During this time the computer system's processor is free to perform other operations.

Figure 4:
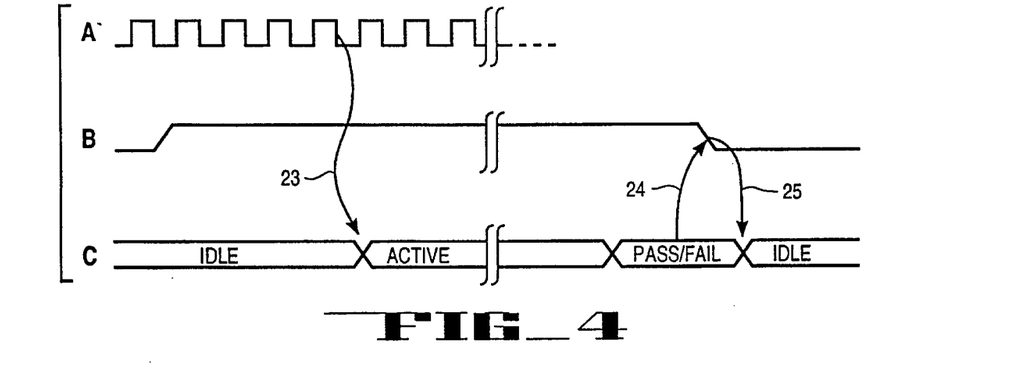
FIG. 4 is a timing diagram illustrating various signals for a second mode of operation of the present invention.

FIG. 4 illustrates a timing diagram of the POST as implemented in one embodiment. In FIG. 4, arrow 23 marks the transition to ACTIVE status following the fourth consecutive clock after the assertion of DO_POST. Following completion of the POST routine, the state machine transitions to either a PASS or a FAIL condition, depending upon the outcome of the POST. The PASS/FAIL status is communicated back to microprocessor 10 (or a tester) via lines 15. The microprocessor responds by deasserting the DO_POST signal, as shown by arrow 24. The deassertion of DO_POST, in turn, causes the state machine of the cache memory to transition to an IDLE state. This is shown by arrow 25 in FIG. 4. The state machine remains in either the POST_PASS or POST_FAIL states of FIG. 2 until the DO_POST signal transitions low.

In one implementation, the POST routine executes what is known as a 13N March pattern, also known as a moving inversion pattern. This pattern, which is applied to both the data and tag arrays of the cache memory, is shown below.

13N March→Dn(W0); Up(R0,W1,R1); Up(R1,W0,R0); Dn(R0,W1,R1); Dn(R1,W0,R0)

where 0=data and 1=inverted data. In the 13N March pattern shown above, Up/Dn refers to the individual addresses of the memory army. For example, the pattern first counts down through the addresses in the array, writing a zero to each memory location, i.e., Dn(W0). The next phase of the pattern then sequences upward through the addresses of the array reading a zero and writing a one to each memory location. It then reads the data it has just written to each address, i.e., Up(R0,W1,R1). The March pattern continues through each of the remaining phases of the POST routine defined above.

Practitioners in the art will appreciate that although the 13N March pattern employed in the above described embodiment of the present invention utilizes five separate testing phases, other POST implementations may use different patterns having one or more testing phases. That is, the actual test pattern applied to the memory array is not essential to the present invention.

In one embodiment, as the POST is performed, a "signature" of the results is collected, providing verification of POST operation. For example, at the end of the POST a full 76-bit signature is collected in the I/O blocks of the secondary cache memory (see FIG. 6). This signature is compared locally against a hardwired or preprogrammed signature containing the expected POST results. If the expected results match the signature, the memory is deemed to have passed the self-test.

After the POST is completed, the state machine within secondary cache memory 11 may transition to a variety of different states as shown in FIG. 2. Three different states are associated with a PASS condition, and three corresponding states are associated with a FAIL condition.

By way of example, in data retention mode (for burn-in reliability testing) the DO_POST signal triggers each individual phase of the 13N March pattern. If bit cells lose charge during the retention test pause between phases, this loss is detected and reported as a FAIL prior to the next phase. In the timing diagram of FIG. 3, POST_STATUS is shown changing from IDLE to ACTIVE in response to the fourth consecutive clock following the assertion of DO_POST, as indicated by arrow 21. Note that in FIG. 3, DO_POST is deasserted while POST is ACTIVE. This indicates that the protocol is operating in data retention mode.

Following completion of the first phase of the 13N March pattern, the apparatus of the present invention either enters the RET_PASS state (state 11 ) or the RET_FAIL state, as indicated by state 00. Regardless of whether the POST passes or fails, in data retention mode there is a pause for a certain number of consecutive clock cycles as part of the retention test. The second phase of the POST sequence then commences in response to the re-assertion of DO_POST (again, after a predetermined number of clock phases). Note that the next state transition is to the PREACTIVE state. In the PREACTIVE state the signature collector and the pass/fail bit are reset prior to starting the next phase of the 13N March pattern (i.e., ACTIVE state).

To obtain toggle rates for burn-in reliability testing, the present invention continues to transition between ACTIVE and PASS/FAIL states until the POST reaches the last phase of the 13N March pattern. That is, following the last 13N March phase, the state machine transitions either to RET_PASS_LAST (state=11) or RET_FAIL_LAST (state=00), as shown in FIG. 2. In retention mode, upon completion of the last phase of the March pattern, the machine transitions back to the IDLE state four clocks after the assertion of DO_POST.

Figure 5:
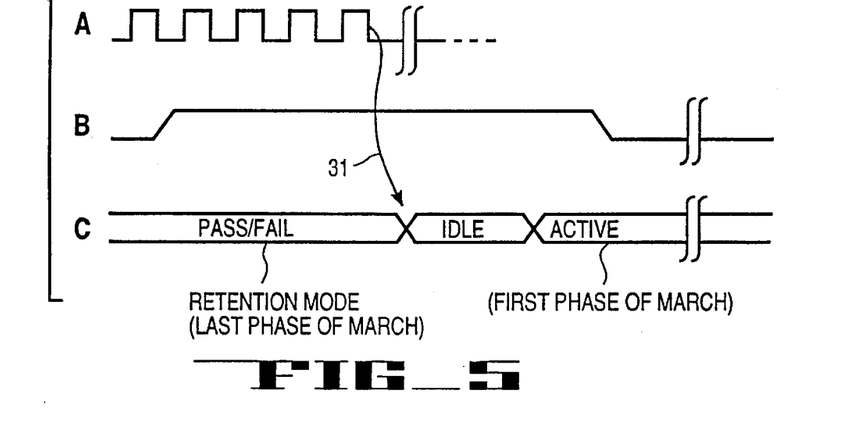
FIG. 5 is a timing diagram illustrating the relationship between various signals at a specific point of operation of the present invention.

FIG. 5 shows the completion of the last phase of the March pattern and a transition through the IDLE state before commencing once again with the first ACTIVE phase of the March pattern. Arrow 31 indicates the transition from PASS/FAIL to IDLE in response to the fourth clock following DO_POST. Thereafter, the machine may then initiate another POST operation (assuming DO_POST has been asserted for four consecutive clocks and there has been no reset from any other state).

Figure 6:
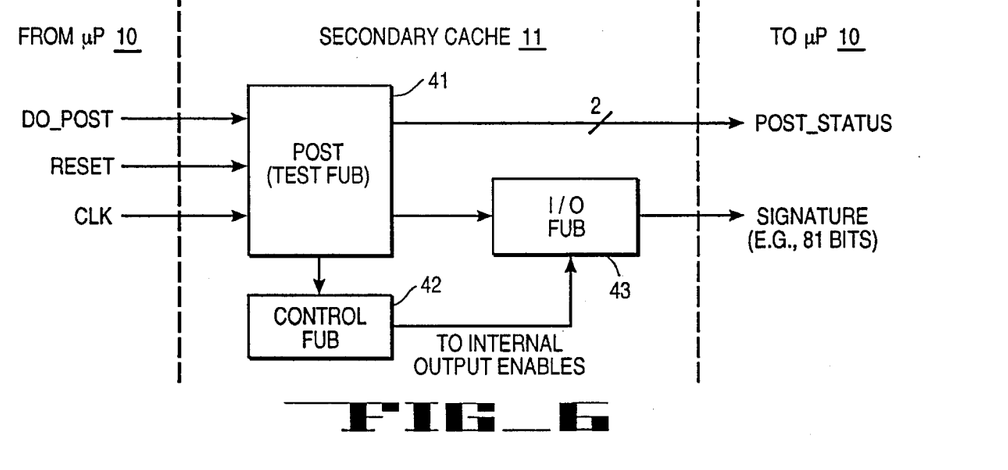
FIG. 6 is a block diagram illustrating the interface protocol signals received and generated by various functional unit blocks of the present invention.

FIG. 6 illustrates a block diagram of one embodiment of the present invention in which a computer system comprises a secondary cache 11 coupled to a microprocessor 10. Block 41 represents the POST functional unit block that includes the state machine defined by FIG. 2, as well as the lower level state machines which perform the 13N March pattern sequencing. A control block 42 interfaces with POST block 41 to provide certain required output enable signals back to the microprocessor. POST block 41 also communicates with an input/output (I/O) functional unit block 43 which provides signature collection and direct compare capability.

As shown, POST block 41 receives DO_POST, RESET, and CLOCK signals from microprocessor 10, and returns POST_STATUS, signature, and enables signals back to processor 10 in accordance with one implementation of the present invention.

To summarize, in a normal operating mode, the DO_POST signal is asserted by a microprocessor (or a tester) in accordance with the present invention to initiate power-on self-test (POST) sequence. This sequence remains ACTIVE until either a PASS or a FAIL state is reached. The assertion of DO_POST triggers a transition from IDLE to ACTIVE state. Once the 13N March pattern has been completed the state machine transitions from ACTIVE to PASS/FAIL This, in turn, signals to the processor (or tester) to deassert DO_POST, which then causes the status bits to transition to the IDLE state.

In data retention mode, DO_POST is deasserted during the ACTIVE portion of each phase of the 13N March pattern. This mode of operation allow for the insertion of a delay or pause in order to test for data retention. After the last phase of the March pattern has finished the machine returns to the IDLE state, and further testing may begin anew.

One of the salient features of the protocol of the present invention is the combination of a debounced DO_POST signal (generated either by a microprocessor or a tester) combined with an interface that is robust—that is, an interface that includes a multi-bit status signal that is returned to the processor (or tester). As explained previously, the robustness of the signaling interface of the present invention overcomes problems inherent in the prior art (e.g., stuck bit errors) that might otherwise occur during POST operations. The toggling of the bits during transition from IDLE to ACTIVE states also ensures that there am no problems with the system interface between the microprocessor and the cache memory.

An important additional feature of the present invention is that a data retention mode of testing is built into the interface protocol to facilitate reliability testing.

What is claimed is:

1. A computer system comprising:

a microprocessor; and an external cache memory coupled to said microprocessor, said cache memory including a memory array and an apparatus for initiating a routine to test said memory array in response to a signal asserted by said microprocessor, said apparatus generating a multi-bit status signal at an output coupled to an input of said microprocessor, said multi-bit status signal communicating a current status of said test routine, said current status including IDLE, ACTIVE, PASS and FAIL states of said test routine, said multi-bit status signal transitioning from said IDLE state to said ACTIVE state in response to said signal from said microprocessor, said ACTIVE state indicating a processing of said test routine, upon a completion of said test routine said ACTIVE state transitioning to said PASS/FAIL state, said PASS/FAIL state indicating an operational integrity of said cache memory, a failure to communicate said ACTIVE state indicates either an error in an interface between said cache memory and said microprocessor or a failure to initiate said test routine.

2. The computer system of claim 1 wherein said microprocessor includes a local cache memory and said external cache memory comprises a secondary cache memory coupled to said microprocessor.

3. The computer system of claim 1 wherein said status signal comprises a 2-bit signal which is inverted between said IDLE and ACTIVE states.

4. The computer system of claim 3 wherein said apparatus initiates said test routine a predetermined of number clock cycles after the assertion of said signal.

5. The computer system of claim 4 wherein said predetermined number is greater than 3.

6. The computer system of claim 4 wherein said microprocessor deasserts said signal after said status signal transitions to either said PASS or FAIL state.

7. The computer system of claim 6 wherein said status signal transitions to said IDLE state after said signal has been deasserted.

8. The computer system of either claims 1,2,3,4,5, 6 or 7 wherein said test routine comprises a moving inversion data pattern.

9. In a computer system which includes a microprocessor coupled to a secondary cache memory, said secondary cache memory including a memory array and circuitry for verifying an integrity of said memory array, a method of operating said system comprising the steps of:

(a) asserting a signal at an output of said microprocessor, said output being coupled to an input of said secondary cache memory to initiate a test routine by said circuitry;

(b) changing a multi-bit status signal from a first state indicating said test routine is idle, to a second state indicating said test routine is active, said status signal being generated by said circuitry and coupled to said microprocessor, wherein a failure to generate said second state status signal indicates either an error in an interface between said second cache memory and said microprocessor, or a failure to initiate said test routine;

(c) changing said status signal from said second state to a third state indicating said array has completed and either passed or failed said test routine;

(d) deasserting said signal by said microprocessor in response to said third state of said status signal; and (e) changing said status signal back to said first state after said signal has been deasserted.

10. The method of claim 9 wherein said multi-bit status signal comprises 2-bit.

11. The method of claim 9 further comprising the step of:

collecting a signature of said test routine.

12. The method of claim 11 wherein said signature is at least 32-bits long.

13. The method of claim 11 further comprising the step of:

comparing said signature against an expected result.

14. In a computer system which includes a microprocessor coupled to a cache memory, said cache memory including a memory array and a circuit for verifying the integrity of said memory array, a method of operating said system comprising the steps of:

(a) asserting a signal of said microprocessor to initiate a test routine by said circuit;

(b) providing a first status signal by said circuit to said microprocessor indicating that said test routine is active, wherein a failure to provide said first status signal indicates either an error in an interface between said cache memory and said microprocessor or a failure to initiate said test routine;

(c) deasserting said signal by said microprocessor while said test routine is active;

(d) providing a second status signal by said circuit to said microprocessor upon the completion of a first phase of said test routine;

(e) pausing for a predetermined time period;

(f) reasserting said signal to initiate a second phase of said test routine.

15. The method of claim 14 further comprising the step of:

(g) providing said first status signal by said circuit to said microprocessor following the reassertion of said signal.

16. The method of claim 15 further comprising the step of: repeating steps (d) and (e).

17. The method of claim 16 further comprising the step of reasserting said signal to initiate a next phase of said test routine; and repeating steps (g), (d) and (e).

18. The method of claim 14 further comprising the step of providing by said circuit a third status signal to said microprocessor indicating that said test routine is idle.

19. The method of claim 16 wherein said first and second status signals are each two-bits long.

20. The method of claims 14,15,16,17,18, or 19 wherein said first status signal is provided N clock pulses, where N is an integer, after the assertion or reassertion of said signal.

21. The method of claim 14 further comprising the step of collecting a signature of said test routine to provide verification of said method of operation.

22. The method of claim 21 wherein said signature is at least 76-bits long.

23. The method of claim 22 further comprising the step of comparing said signature to an expected signature result.

24. A cache memory which provides secondary data storage for a microprocessor, the cache memory being fabricated on a semiconductor substrate apart from the microprocessor and comprising:

a storage array;

a test unit which initiates an N-phase test sequence for testing the operational integrity of the memory array when a start signal coupled to the cache memory is asserted, the unit including means for providing a multi-bit status signal that transitions from an IDLE state to an ACTIVE state after the start signal has been asserted and the test sequence has begun, wherein a failure to provide said ACTIVE state indicates either an error in an interface between said cache and said microprocessor or a failure to initiate said N-Phase test sequence, the test unit responding in a mode of operation when the start signal is deasserted and the status signal is in the ACTIVE state, whereupon following the completion of a first phase of the test sequence the status signal transitions from the ACTIVE state to a PASS/FAIL state, thereafter the status signal transitioning from the PASS/FAIL state to the ACTIVE state once the start signal has been reasserted and a next phase of the test sequence has begun, the test unit alternately transitioning between the ACTIVE and PASS/FAIL states in response to the assertion and deassertion of the start signal until completion of the Nth phase of the test sequence, assertion of the start signal following completion of the Nth phase causing the status signal to transition from the PASS/FAIL state to the IDLE state.

25. The cache memory of claim 24 wherein transitions of the status signal occur a predetermined number of clock cycles following the assertion or deassertion of the start signal.

26. The cache memory of claim 25 wherein the predetermined number of clock cycles is greater than three.

27. The cache memory of claim 25 wherein the start signal is provided by the microprocessor.

28. The cache memory of claim 25 wherein the start signal is provided by a tester.

29. The cache memory of claims 27 or 28 wherein the test unit responds in an alternate mode of operation when the start signal remains asserted while the status signal is in the ACTIVE state, in the alternative mode of operation the status signal transitioning from the ACTIVE state to the PASS/FAIL state upon completion of the Nth phase of the test sequence, thereafter the status signal transitioning from the PASS/FAIL to the IDLE state in response to the deassertion of the start signal.

30. The cache memory of claim 29 further comprising an input/output (I/O) unit which includes means for comparing results of the test sequence against an expected result.

31. The cache memory of claim 30 wherein the test sequence comprises a moving inversion data pattern.

32. A computer system comprising:

a microprocessor; and an external cache memory coupled to said microprocessor, said cache memory including a memory array and an apparatus for initiating a routine to test said memory array in response to a signal asserted by said microprocessor, said signal generated in response to said microprocessor being powered on, said apparatus generating a multi-bit status signal at an output coupled to an input of said microprocessor, said multi-bit status signal communicating a current status of said test routine, said current status including IDLE, ACTIVE, PASS and FAIL states of said test routine, said multi-bit status signal transitioning from said IDLE state to said ACTIVE state in response to said signal from said microprocessor, said ACTIVE state indicating a processing of said test routine, upon a completion of said test routine said ACTIVE state transitioning to said PASS/FAIL state, said PASS/FAIL state indicating an operational integrity of said cache memory, a failure to communicate said ACTIVE state indicates either an error in an interface between said cache memory and said microprocessor or a failure to initiate said test routine.

* * * * *

UNITED STATES PATENT AND TRADEMARK OFFICE
CERTIFICATE OF CORRECTION

PATENT NO. : 5,617,534  Page 1 of 2
DATED : April 1, 1997
INVENTOR(S) : Balmer et al.

It is certified that error appears in the above-identified patent and that said Letters Patent is hereby corrected as shown below:

In column 1 at line 55 delete "army" and insert --array--

In column 2 at line 6 delete "army" and insert --array--

In column 2 at line 16 delete "FAIL" and insert --FAIL--

In column 3 at line 32 delete "FAIL," and insert --FAIL,--

In column 3 at line 49 delete "PASS/FAIL," and insert --PASS/FAIL,--

In column 4 at line 65 delete "FAIL" and insert --FAIL--

In column 4 at line 66 delete "PASS/FAIL" and insert --PASS/FAIL--

In column 5 at line 6 delete "POST_FAIL" and insert --POST_FAIL--

In column 5 at line 16 delete "army." and insert --array.--

In column 5 at line 50 delete "FAIL" and insert --FAIL--

In column 6 at line 6 delete "PASS/FAIL" and insert --PASS/FAIL--

In column 6 at line 18 delete "FAIL" and insert --FAIL--

UNITED STATES PATENT AND TRADEMARK OFFICE
CERTIFICATE OF CORRECTION

PATENT NO. : 5,617,534

DATED : April 1, 1997

INVENTOR(S) : Balmer et al.

It is certified that error appears in the above-identified patent and that said Letters Patent is hereby corrected as shown below:

In column 6 at line 67 delete "am" and insert --are--

In column 8 at line 6 delete "bit." and insert --bits.--

Signed and Sealed this

Fifteenth Day of July, 1997

Attest:

Attesting Officer

BRUCE LEHMAN

Commissioner of Patents and Trademarks